US009083337B2

(12) United States Patent
Smith et al.

(10) Patent No.: US 9,083,337 B2
(45) Date of Patent: Jul. 14, 2015

(54) MULTI-THRESHOLD SLEEP CONVENTION LOGIC WITHOUT NSLEEP

(71) Applicants: Scott Christopher Smith, Rogers, AR (US); Jia Di, Fayetteville, AR (US)

(72) Inventors: Scott Christopher Smith, Rogers, AR (US); Jia Di, Fayetteville, AR (US)

(73) Assignee: THE BOARD OF TRUSTEES OF THE UNIVERSITY OF ARKANSAS, Little Rock, AR (US)

( * ) Notice: Subject to any disclaimer, the term of this patent is extended or adjusted under 35 U.S.C. 154(b) by 240 days.

(21) Appl. No.: 13/739,778

(22) Filed: Jan. 11, 2013

(65) Prior Publication Data

US 2013/0181740 A1    Jul. 18, 2013

Related U.S. Application Data

(60) Provisional application No. 61/586,131, filed on Jan. 13, 2012.

(51) Int. Cl.
*H03K 19/173* (2006.01)
*H03K 19/00* (2006.01)
*H03K 19/096* (2006.01)

(52) U.S. Cl.
CPC .......... *H03K 19/173* (2013.01); *H03K 19/0016* (2013.01); *H03K 19/0963* (2013.01)

(58) Field of Classification Search
None
See application file for complete search history.

(56) References Cited

U.S. PATENT DOCUMENTS

| | | | |
|---|---|---|---|
| 6,208,171 B1 * | 3/2001 | Kumagai et al. | 326/121 |
| 6,946,869 B2 * | 9/2005 | Jacobson et al. | 326/33 |
| 7,977,972 B2 | 7/2011 | Di et al. | |
| 2003/0218231 A1 | 11/2003 | Sani et al. | |
| 2005/0184758 A1 | 8/2005 | Hoberman et al. | |
| 2005/0242862 A1 | 11/2005 | Won et al. | |
| 2008/0157842 A1 | 7/2008 | Kim et al. | |
| 2009/0066386 A1 | 3/2009 | Lee | |
| 2011/0032000 A1 * | 2/2011 | Di et al. | 326/98 |

OTHER PUBLICATIONS

International Search Report and Written Opinion for Application No. PCT/US2013/021198 dated Jun. 21, 2013 (11 pages).

* cited by examiner

*Primary Examiner* — Crystal L Hammond
(74) *Attorney, Agent, or Firm* — Michael Best & Friedrich LLP

(57) ABSTRACT

A Static Sleep Convention Logic (SSCL) circuit. The circuit improves upon Multi-Threshold NULL Convention Logic (MTNCL), disclosed in U.S. Pat. No. 7,977,972, by utilizing the SECRII architecture along with the Bit-Wise MTNCL technique, to produce a new SSCL gate without an nsleep input, which yields a smaller and faster circuit that utilizes less energy per operation than the patented SMTNCL gate design, while only very slightly increasing leakage power during sleep mode.

9 Claims, 8 Drawing Sheets

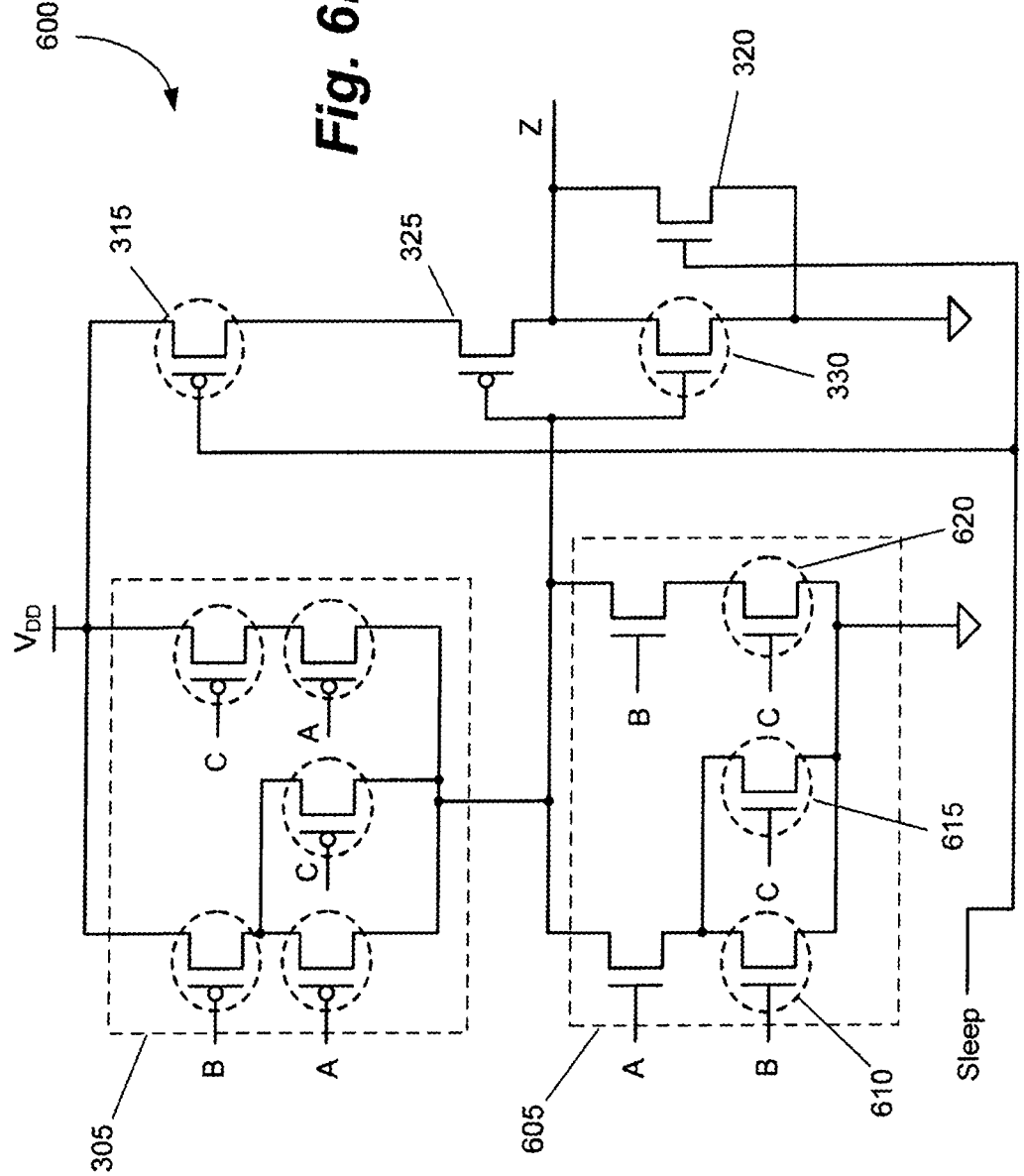

MULTI-THRESHOLD SLEEP CONVENTION LOGIC WITHOUT NSLEEP

RELATED APPLICATION

The present patent application claims the benefit of prior filed U.S. Provisional Patent Application No. 61/586,131, filed on Jan. 13, 2012, the entire content of which is hereby incorporated by reference.

BACKGROUND

With the current trend of semiconductor devices scaling into the deep submicron region, design challenges that were previously minor issues have now become increasingly important. Where in the past, dynamic, switching power has been the predominant factor in CMOS digital circuit power dissipation, the recent dramatic decrease of supply and threshold voltages has spurred a need for new design methodologies for digital integrated circuits (ICs) to address the significant growth in leakage power demands. The main component of leakage power is sub-threshold leakage, caused by current through a transistor even if it is supposedly turned off. Sub-threshold leakage increases exponentially with decreasing transistor feature size.

Among the many techniques proposed to control or minimize leakage power in deep submicron technology, Multi-Threshold CMOS (MTCMOS), which reduces leakage power by disconnecting the power supply from the circuit during idle (or sleep) mode while maintaining high performance in active mode, is very promising. MTCMOS incorporates transistors with two or more different threshold voltages (Vt) in a circuit. Low-Vt transistors offer fast speed but have high leakage, whereas high-Vt transistors have reduced speed but far less leakage current. MTCMOS combines these two types of transistors by utilizing low-Vt transistors for circuit switching to preserve performance and high-Vt transistors to gate the circuit power supply to significantly decrease sub-threshold leakage.

There are multiple ways to implement MTCMOS in synchronous circuits. One method is to use low-Vt transistors for critical paths to maintain high performance, while using slower high-Vt transistors for the non-critical paths to reduce leakage. Besides this path replacement methodology, there are two other architectures for implementing MTCMOS. A coarse-grained technique uses low-Vt logic for all circuit functions and gates the power to entire logic blocks with high-Vt sleep transistors, as shown in FIG. 1. The sleep transistors are controlled by a Sleep signal. During active mode, the Sleep signal is deasserted, causing both high-Vt transistors to turn on and provide a virtual power and ground to the low-Vt logic. When the circuit is idle, the Sleep signal is asserted, forcing both high-Vt transistors to turn off and disconnect power from the low-Vt logic, resulting in a very low sub-threshold leakage current. One major drawback of this method is that partitioning the circuit into appropriate logic blocks and sleep transistor sizing is difficult for large circuits. An alternative fine-grained architecture, shown in FIG. 2, incorporates the MTCMOS technique within every gate, using low-Vt transistors for the Pull-Up Network (PUN) and Pull-Down Network (PDN) and a high-Vt transistor to gate the leakage current between the two networks. Two additional low-Vt transistors are included in parallel with the PUN and PDN to maintain nearly equivalent voltage potential across these networks during sleep mode. Implementing MTCMOS within each gate solves the problems of logic block partitioning and sleep transistor sizing; however, this results in a large area overhead.

In general, three serious drawbacks hinder the widespread usage of MTCMOS in synchronous circuits: 1) the generation of Sleep signals is timing critical, often requiring complex logic circuits; 2) synchronous storage elements lose data when the power transistors are turned off during sleep mode; and 3) logic block partitioning and transistor sizing is very difficult for the coarse-grained approach, which is critical for correct circuit operation, and the fine-grained approach requires a large area overhead.

SUMMARY

The invention pertains to the fields of Computer Engineering and Electrical Engineering. The invention improves upon the Multi-Threshold NULL Convention Logic (MTNCL) disclosed in U.S. Pat. No. 7,977,972 (the '972 patent), filed on Apr. 30, 2010, the entire content of which is hereby incorporated by reference, by offering improved speed and reduced energy consumption with only a minimal increase in leakage power.

In one embodiment, the invention provides a Static Sleep Convention Logic (SSCL) circuit. The circuit includes a first circuit coupled to $V_{DD}$ (the integrated power supply pin), a set circuit coupled to the first circuit and to ground, a high-threshold PMOS transistor coupled to $V_{DD}$ and driven by a SLEEP signal, a low-threshold PMOS transistor coupled to the high-threshold PMOS transistor and driven by the coupling between the first circuit and the set circuit, a high-threshold NMOS transistor coupled between the low-threshold PMOS transistor and ground and driven by the coupling between the first circuit and the set circuit, a low-threshold NMOS transistor coupled between the coupling of the high-threshold NMOS transistor and the low-threshold PMOS transistor and ground, the low-threshold NMOS transistor driven by the SLEEP signal, and an output coupled to the coupling between the high-threshold NMOS transistor, the low-threshold PMOS transistor, and the low-threshold NMOS transistor.

In some embodiments, the first circuit of the SSCL is a hold0 circuit comprised of high-threshold transistors. The set circuit also includes a high-threshold transistor for every path to ground. The SSCL circuit also does not have a nsleep input.

In another embodiment, the invention provides a slept early completion and registration input incomplete asynchronous circuit (SECRII). The circuit includes a delay insensitive register having a data input and a data output, a SSCL circuit having a data input coupled to the delay insensitive register data output, a sleep input, and a data output, and a slept early completion circuit having a first input coupled to an output of an early completion circuit of a subsequent SECRII, a second input coupled to the output of an early completion circuit of a previous SECRII, a third input coupled to the delay insensitive register data input, and an output coupled to the sleep input.

The delay insensitive register is a slept delay insensitive register which includes a sleep input coupled to the slept early completion circuit output. The slept early completion circuit outputs a request for data when the first input is a request for null and the second input is a request for data. The early completion circuit outputs a request for null when the first input is a request for data, the second input is a request for null, and the third input is a data. The early completion circuit maintains its output as a request for null until the first input is a request for null and the second input is a request for data.

The early completion circuit maintains its output as a request for data until the first input is a request for data, the second input is a request for null, and the third input is a data.

Other aspects of the invention will become apparent by consideration of the detailed description and accompanying drawings.

BRIEF DESCRIPTION OF THE DRAWINGS

FIG. 6B is a schematic diagram of a SSCL TH23 implementation.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

U.S. Pat. No. 7,977,972, previously incorporated by reference, introduced a Static Multi-Threshold NULL Convention Logic (SMTNCL) gate structure 300 (see FIGS. 3A and 3B), which reduced or eliminated a glitch found with the Multi-Threshold NULL Convention Logic (MTNCL) gate structure. Note that MTNCL is also referred to as Sleep Convention Logic (SCL). Using the SMTNCL gate structure with a Slept Early Completion and Registration Input-Incomplete (SECRII) architecture 400 (FIG. 4) resulted in an ultra-low power multi-threshold asynchronous circuit.

Figure 1:
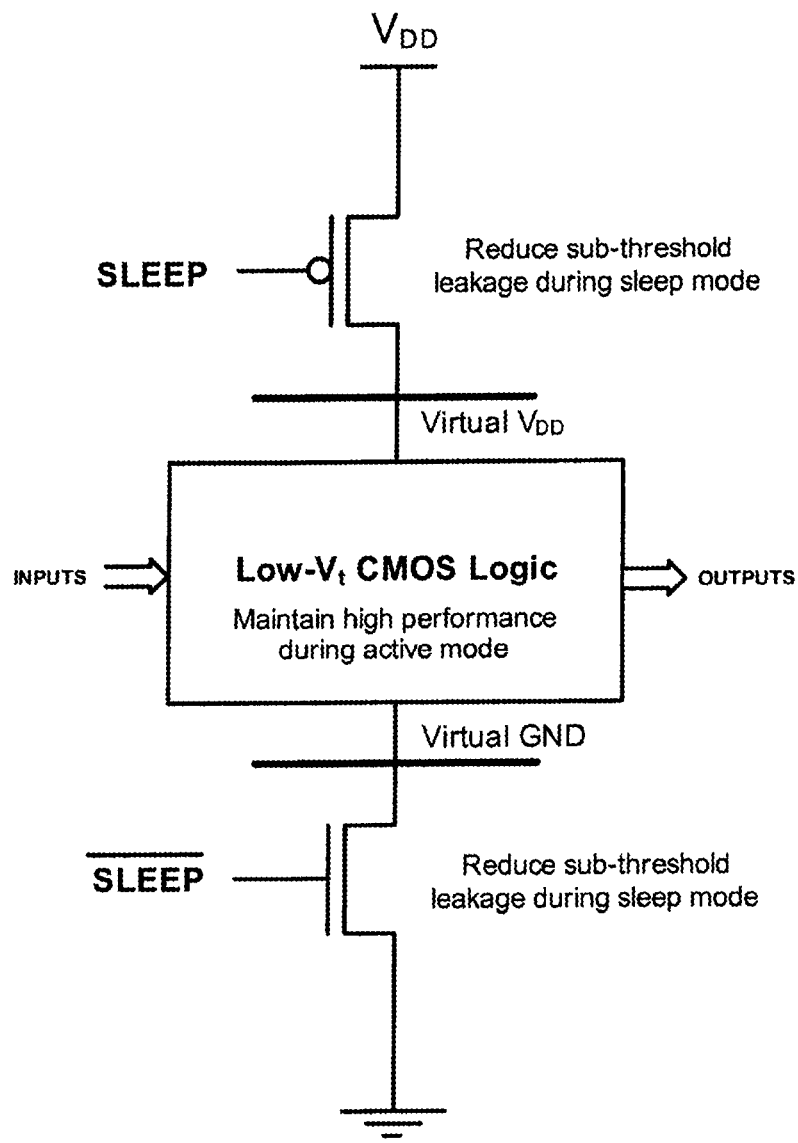
FIG. 1 is a schematic diagram of a prior art MTCMOS circuit architecture.
Figure 2:
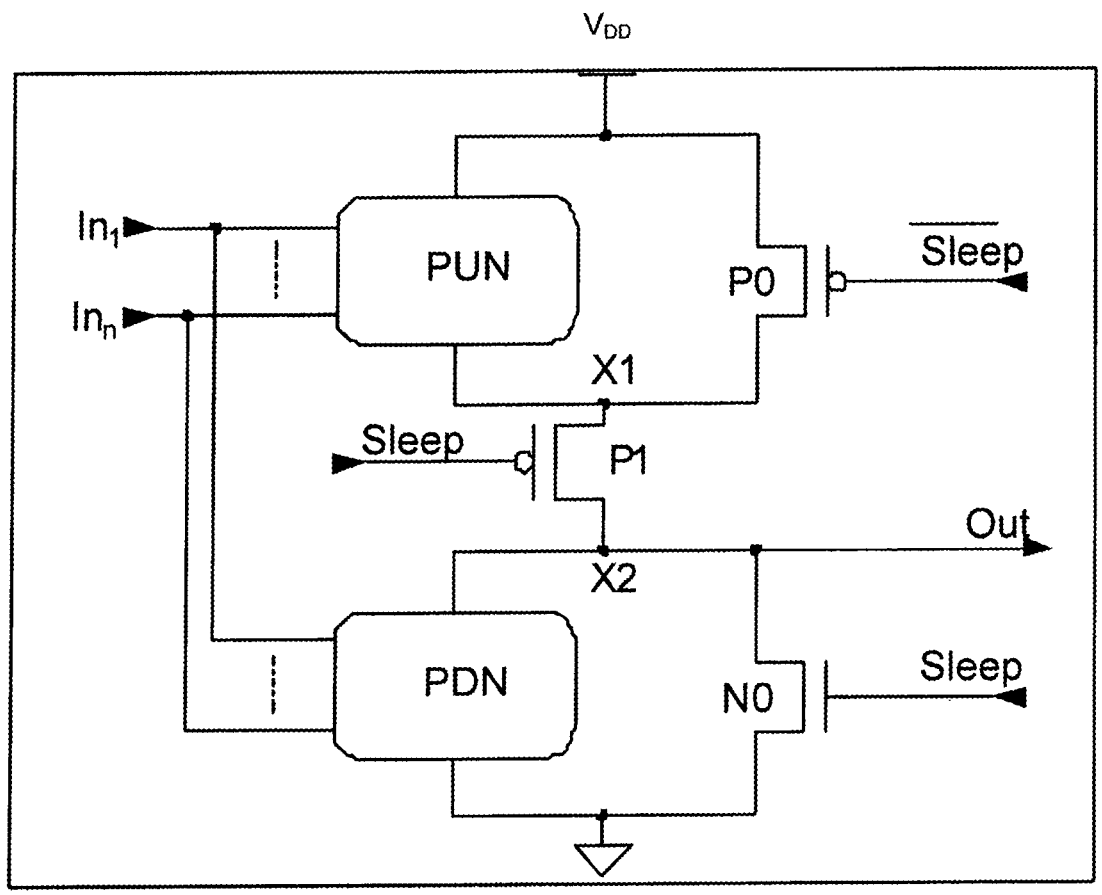
FIG. 2 is a schematic diagram of a prior art MTCMOS circuit as applied to a Boolean gate.
Figure 3A:
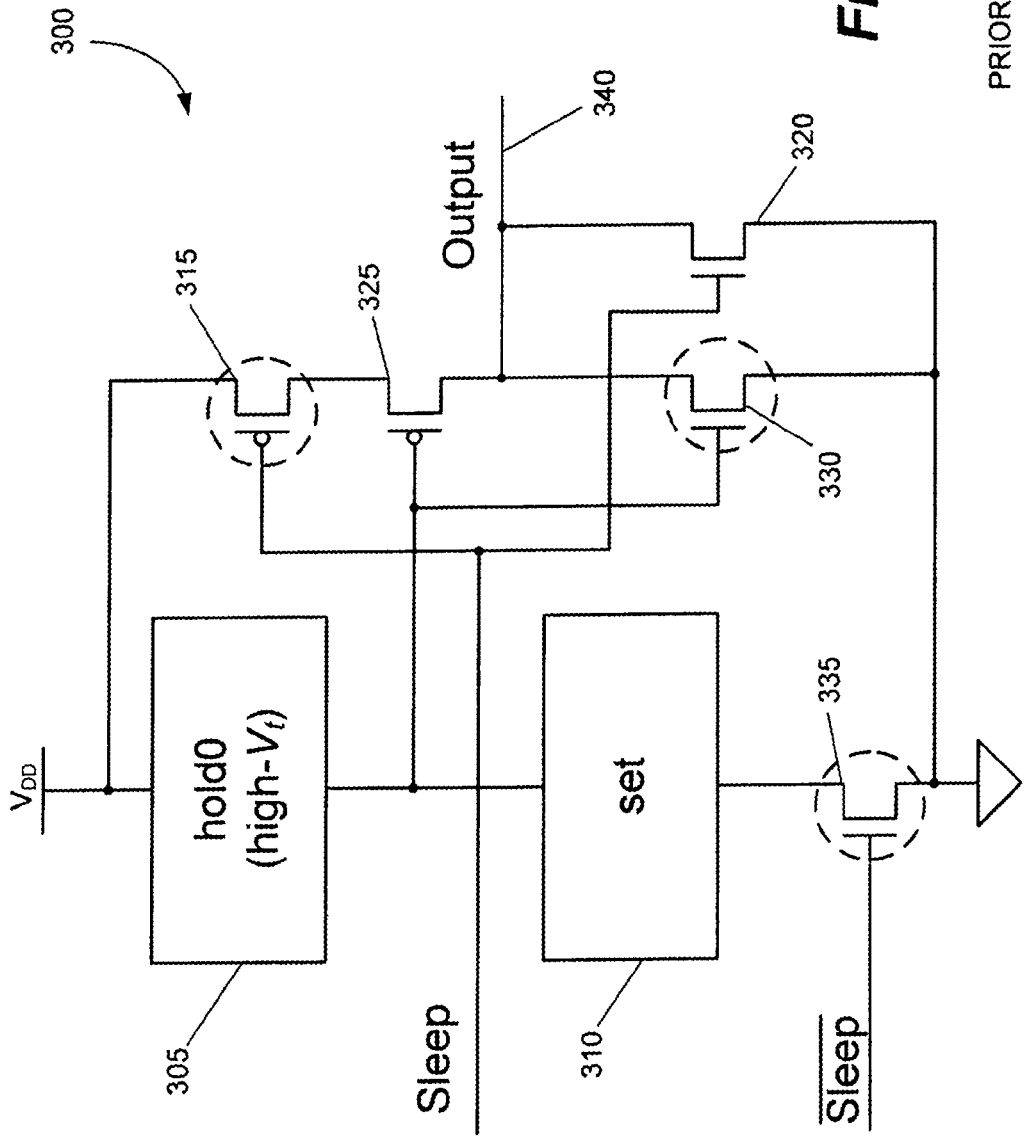
FIG. 3A is a schematic diagram of a prior art SMTNCL gate structure.
Figure 4:
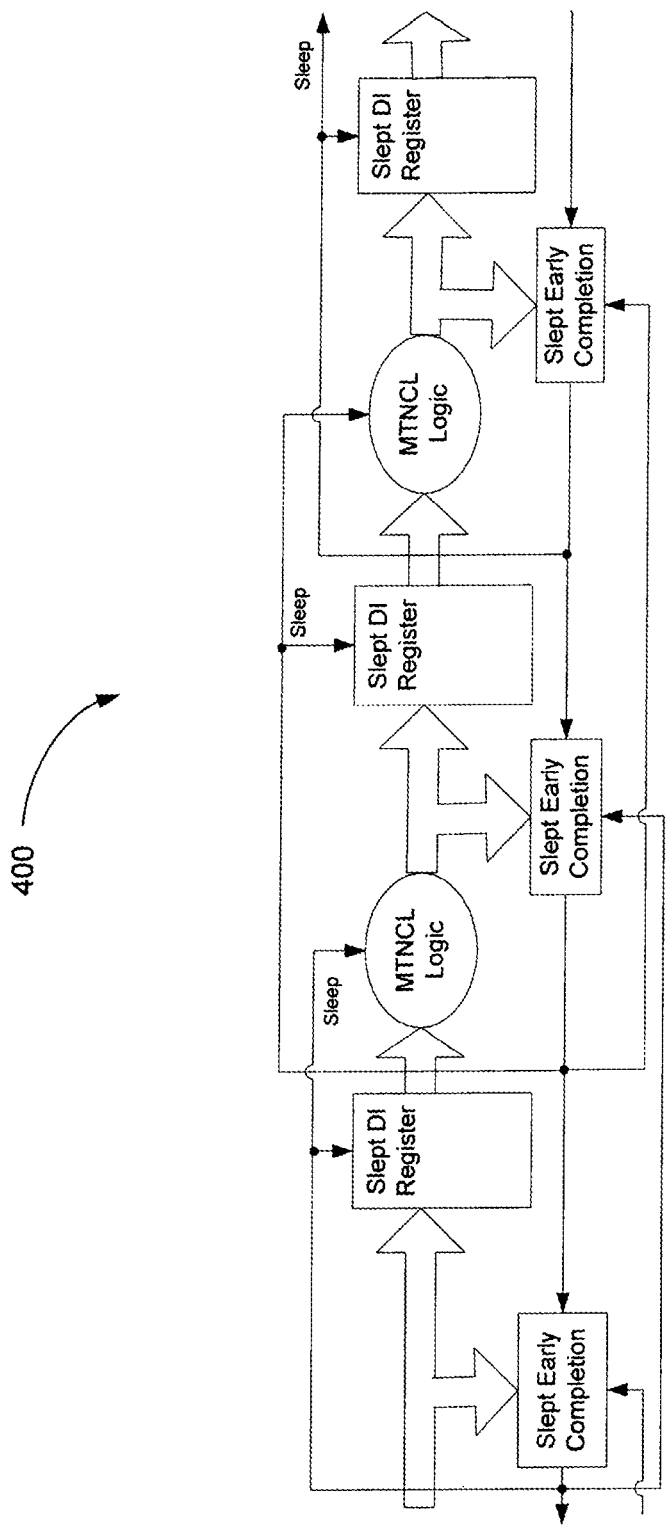
FIG. 4 is a block diagram of a prior art Slept Early Completion and Registration Input-Incomplete (SECRII) architecture.

Referring to FIG. 3A, the SMTNCL gate 300 includes a Hold0 circuit 305, a Set circuit 310, a sleep isolation high-Vt transistor 315, a sleep low-Vt drive transistor 320, a low-Vt output drive transistor 325, a high-Vt output hold transistor 330, and an nsleep high-Vt isolation transistor 335. The sleep isolation high-Vt transistor 315 operates to isolate an output 340 from $V_{DD}$ when the sleep input is asserted, and the sleep low-Vt drive transistor 320 operates to drive the output 340 to ground when the sleep input is asserted. The low-Vt output drive transistor 325 operates to drive the output 340 to $V_{DD}$ when the logic output is asserted, and the high-Vt output hold transistor 330 operates to hold the output 340 at ground when the logic output is deasserted. The nsleep high-Vt isolation transistor 335 and the sleep isolation high-Vt transistor 315 operate to prevent leakage current from flowing in sleep mode.

Figure 3B:
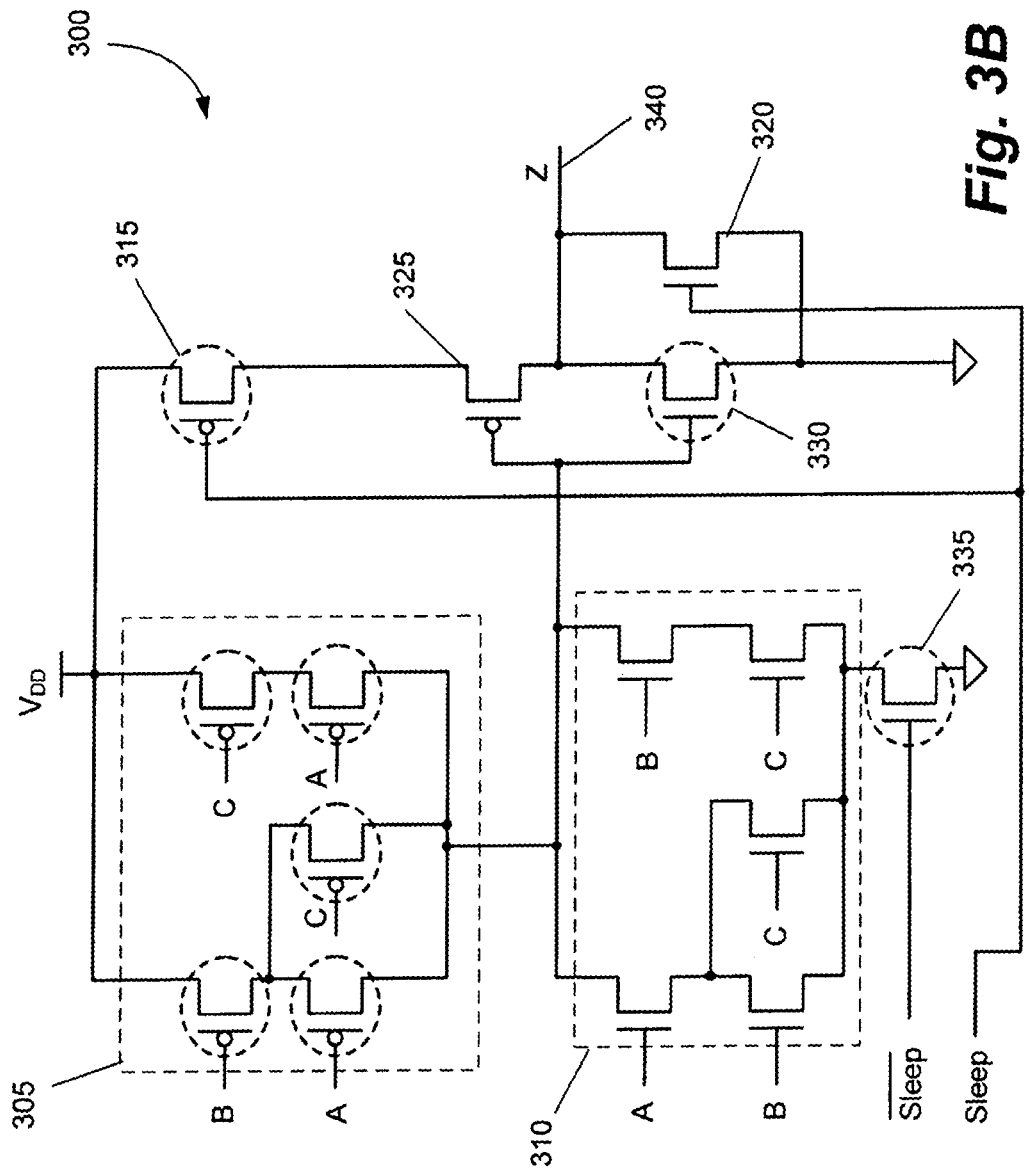
FIG. 3B is a schematic diagram of a prior art SMTNCL TH23 implementation.

FIG. 3B shows an SMNTCL gate design applied to a TH23 circuit. A TH23 gate is a gate providing the Boolean function AB+AC+BC. The Hold0 circuit 305 incorporates high-Vt transistors to reduce leakage current, while the Set circuit 310 uses all low-Vt transistors to maximize the switching speed of the circuit.

The invention improves on the design of the SMTNCL gate design, yielding a smaller and faster circuit, which utilizes less energy per operation than the SMTNCL gate design, while increasing leakage power during sleep mode a relatively insignificant amount.

Figure 5:
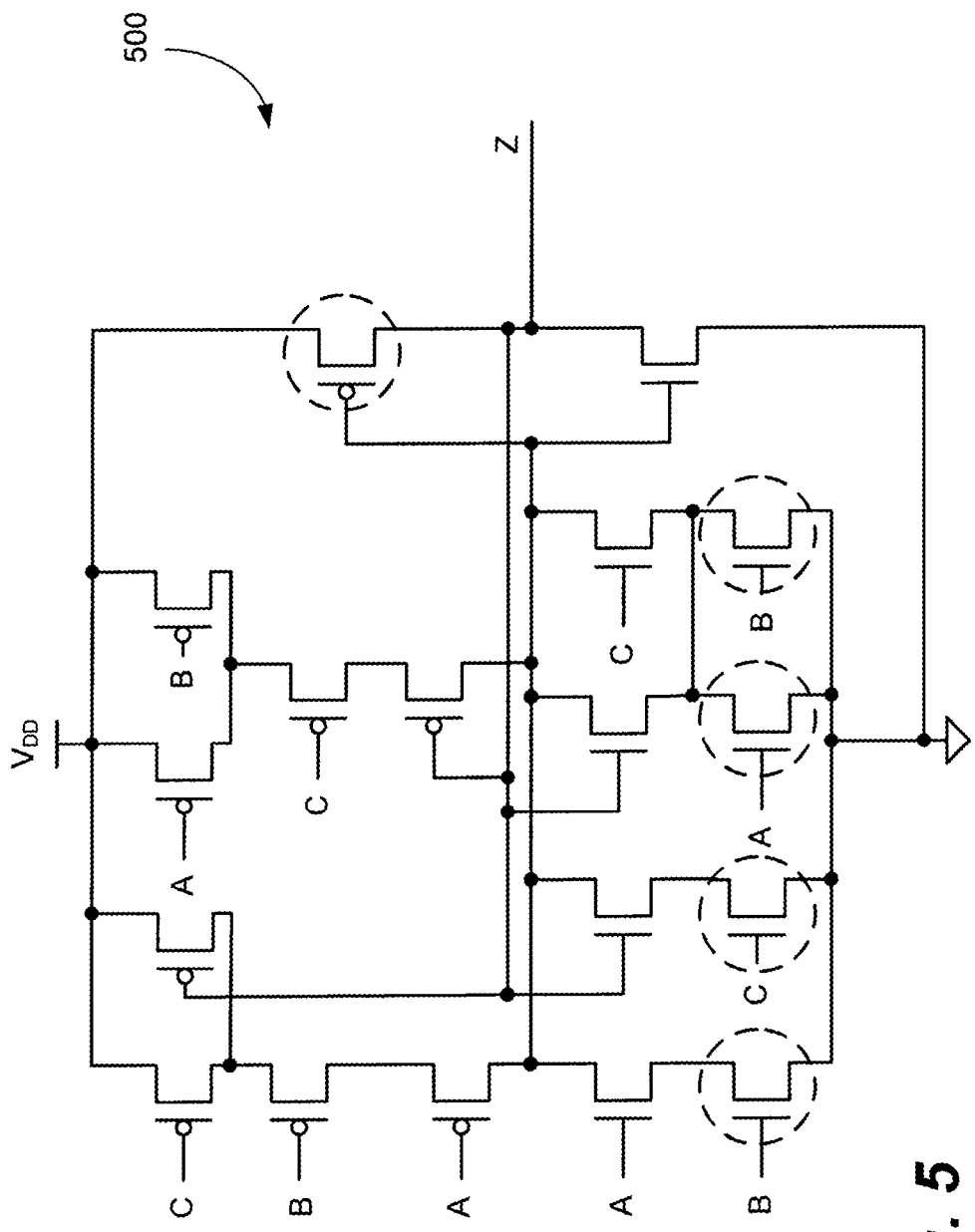
FIG. 5 is a schematic diagram of a prior art BWMTNCL TH23 implementation.

FIG. 5 shows a Bit-Wise MTNCL (BWMTNCL) circuit 500 applied to a TH23 gate. BWMTNCL yields an ultra-low power methodology for bit-wise pipelined NCL systems. Direct application of the MTNCL concept (i.e., utilizing Early Completion and sleeping gates in lieu of the NULL cycle) to bit-wise pipelined NCL systems results in excessive overhead. BWMTNCL instead utilizes the regular NCL architecture along with the regular NCL gate design, modified to utilize the minimum number of high-Vt transistors such that all paths from $V_{DD}$ to ground contain a high-Vt transistor. Even though BWMTNCL was originally developed for bit-wise pipelined NCL systems, the BWMTNCL gates can also be used for full-word pipelined NCL systems.

Figure 6A:
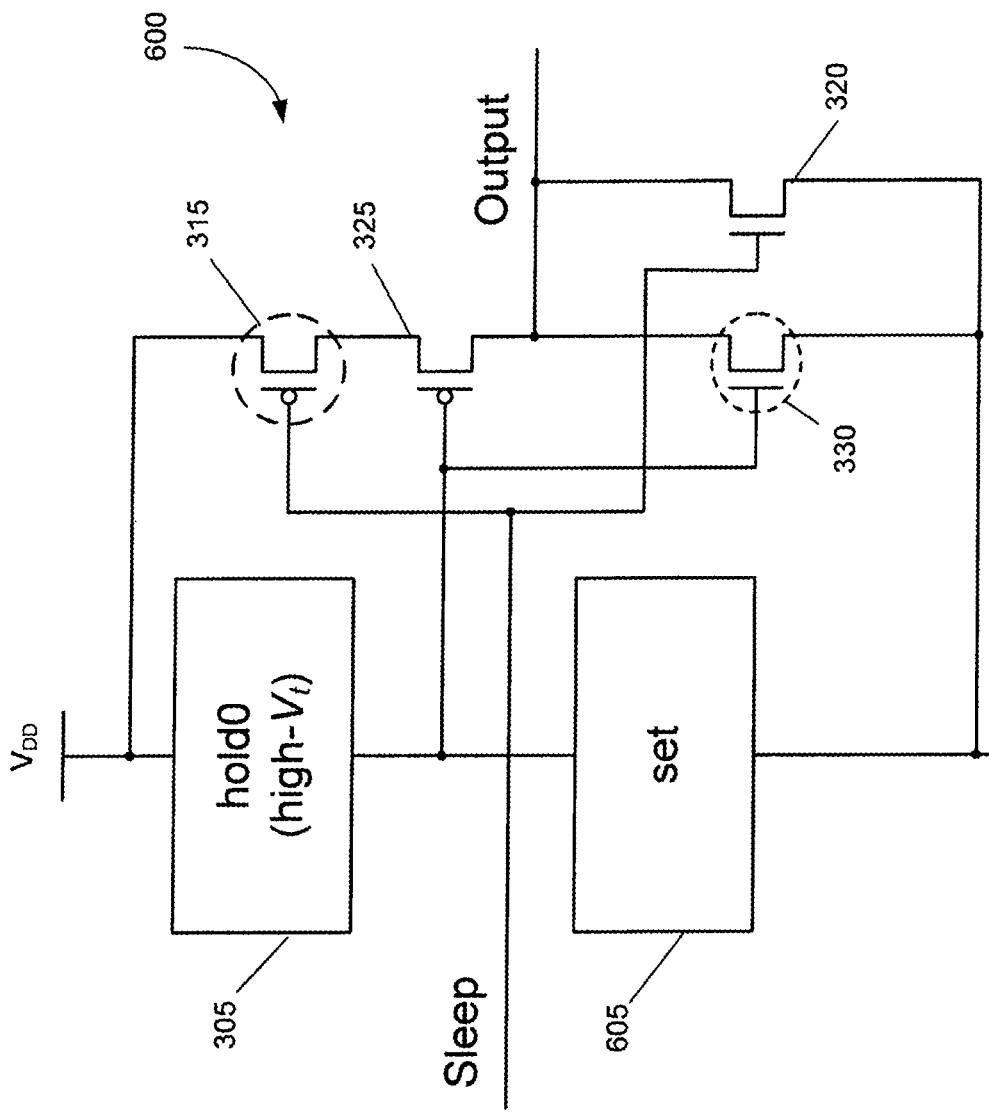
FIG. 6A is a schematic diagram of a SSCL gate structure.

The SMTNCL gates utilized in the SECRII architecture require both a Sleep and nsleep input, each of which necessitates a large buffer tree. Hence, eliminating one of these inputs would decrease area and energy. To eliminate the $\overline{\text{Sleep}}$ (nsleep) input from the SMTNCL gate, the SMTNCL architecture in FIGS. 3A and 3B is combined with the BWMTNCL architecture in FIG. 5, to produce a Static SCL (SSCL) gate 600 shown in FIGS. 6A and 6B. Instead of utilizing the high-Vt transistor 335 to gate the Set logic 310 from ground, a Set logic 605 is implemented in BWMTNCL fashion utilizing the minimum number of high-Vt transistors such that all paths through the set function to ground contain a high-Vt transistor. Thus, a plurality of transistors in the Set logic 605 are implemented as high-Vt transistors 610, 615, and 620.

To compare the performance of the SSCL design with prior MTNCL architectures, a number of 4-stage pipelined IEEE single-precision floating-point co-processors, which perform addition, subtraction, and multiplication, were designed using the 1.2V IBM 8RF-LM 130 nm CMOS process, and were simulated at the transistor level after inserting buffers using a Cadence® UltraSim simulator running a VerilogA controller in mixed-signal mode. The input patterns were randomized, and the same input patterns were used for the different designs. Note that all transistors are minimum sized except for the buffers. Table 1 lists the simulation results. The floating-point co-processor has two distinct datapaths, the add/subtract unit and the multiplier unit. Each unit has different throughput, so the data for each unit is presented separately, and can be averaged to yield a combined result. $T_{DD}$ is the average DATA plus NULL processing time, which is comparable to the clock period for a synchronous circuit. $T_{DD}$ and Energy/Operation are calculated while the circuit is operating at its maximum speed. Further, Leakage Power is calculated using DC analysis after the pipeline is flushed with all NULL inputs.

TABLE 1

| | # transistors | $T_{DD}$ (ns) | | Energy/Operation (pJ) | | Leakage Power (nW) | |
|---|---|---|---|---|---|---|---|
| | | add/sub | mult | add/sub | mult | add/sub | mult |
| BWMTNCL | 158059 | 17.9 | 16.2 | 27.1 | 23.7 | 190.7 | 190.7 |
| SMTNCL with SECRII | 96640 | 11.1 | 14.8 | 13.5 | 25.3 | 111.2 | 111.2 |
| SSCL with SECRII w/o nsleep | 90041 | 10 | 13.9 | 12.1 | 21.8 | 112.1 | 112.1 |

Comparing the various designs shows that the SSCL with SECRII without nsleep design that combines the SMTNCL with SECRII and BWMTNCL architectures reduces area and energy, increases speed, and results in only a slight increase in leakage power.

Therefore, the invention provides a new and useful gate design, yielding a smaller and faster circuit, which utilizes less energy per operation than the SMTNCL gate design, while increasing leakage power during sleep mode a relatively insignificant amount.

What is claimed is:

1. A slept early completion and registration input incomplete asynchronous circuit (SECRII), the circuit comprising:
   a delay insensitive register having a data input and a data output;
   a Static Sleep Convention Logic (SSCL) circuit having a data input coupled to the delay insensitive register data output, a sleep input, and a data output; and
   a slept early completion circuit having a first input coupled to an output of an early completion circuit of a subsequent SECRII, a second input coupled to the output of an early completion circuit of a previous SECRII, a third input coupled to the delay insensitive register data input, and an output coupled to the sleep input.

2. The circuit of claim 1, wherein the delay insensitive register is a slept delay insensitive register and includes a sleep input coupled to the slept early completion circuit output.

3. The circuit of claim 1, wherein the slept early completion circuit outputs a request for data when the first input is a request for null and the second input is a request for data.

4. The circuit of claim 1, wherein the slept early completion circuit outputs a request for null when the first input is a request for data, the second input is a request for null, and the third input is a null.

5. The circuit of claim 1, wherein the slept early completion circuit maintains its output as a request for null until the first input is a request for null and the second input is a request for data.

6. The circuit of claim 1, wherein the slept early completion circuit maintains its output as a request for data until the first input is a request for data, the second input is a request for null, and the third input is a data.

7. The circuit of claim 1, wherein the circuit is faster than an SECRII circuit implemented using Static Multi-Threshold NULL Convention Logic.

8. The circuit of claim 1, wherein the circuit uses less energy than an SECRII circuit implemented using Static Multi-Threshold NULL Convention Logic.

9. The circuit of claim 1, wherein the circuit is physically smaller than an SECRII circuit implemented using Static Multi-Threshold NULL Convention Logic.

* * * * *